(12) United States Patent  
Bao et al.

(10) Patent No.: US 6,252,253 B1  
(45) Date of Patent: Jun. 26, 2001

(54) PATTERNED LIGHT EMITTING DIODE DEVICES

(75) Inventors: Zhenan Bao, North Plainfield; John A. Rogers, New Providence, both of NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/095,236

(22) Filed: Jun. 10, 1998

(51) Int. Cl.[7] ............................ H01L 33/00; H01J 1/62
(52) U.S. Cl. .......................... 257/89; 257/103; 313/506; 313/509
(58) Field of Search ................... 257/40, 88, 89, 257/103; 313/506, 509

(56) References Cited

U.S. PATENT DOCUMENTS 5,936,347 * 8/1999 Isaka et al. ........................ 313/509

FOREIGN PATENT DOCUMENTS 8-234688  2/1995  (JP) ............................... G09F/13/20

OTHER PUBLICATIONS

"IEEE Journal of Selected Topics in Quantum Electronics", by Shoustikov, A. A. et al., *Journal of Selected Topics in Quantum Electroncs*, vol. 4, No. 1, pp. 8–11 (Jan./Feb. 1998).

"Poly(p–phenylene vinylene)/tris(8–hydroxy) Quninoline Aluinum Heterstructure Light Emitting Diode", by Wu, C. C. et al., *Appl. Phys. Lett.*, Lett. 66 (6), pp. 653–655 (Feb. 6, 1995).

"Microlithographicc Process for Patterning Conjugated Emissive Polymers", by Renar, M. L. et al., *Adv. Mater.*, 9, No. 5, pp. 393–395 (1997).

"Photoprocessed and Micropatterned Conjugated Polymer LEDs", by Lidzey, D. G. et al., *Synthetic Metals*, 82, pp. 141–148 (1996).

* cited by examiner

Primary Examiner—Minh Loan Tran  
(74) Attorney, Agent, or Firm—Richard J. Botos

(57) ABSTRACT

An LED device that emits light in a pattern is disclosed. The LED device is a layer of active material that is sandwiched between a transparent substrate with an anode formed thereon and a cathode. The active material has a layer of light emitting material that emits light when electron/hole recombination is induced in the material. The patterned emission is defined by a patterned layer in the active material of the LED device. The patterned layer has at least a first thickness and a second thickness. When the device is on, the portion of the device associated with the first thickness of the patterned layer is visually distinct from the portion of the device that is associated with the second thickness of the patterned layer.

7 Claims, 4 Drawing Sheets

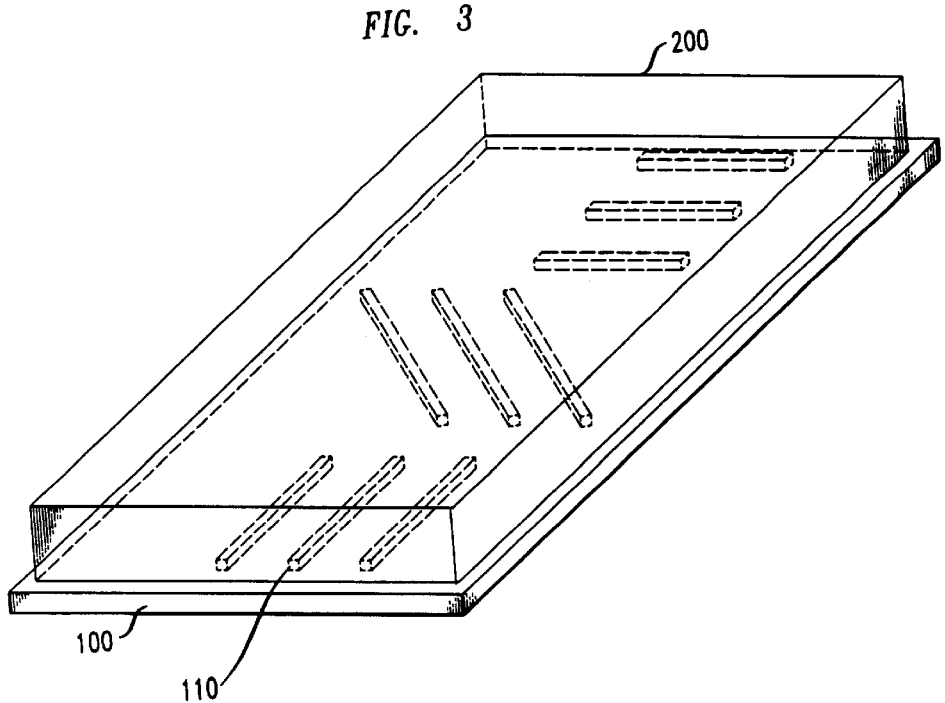
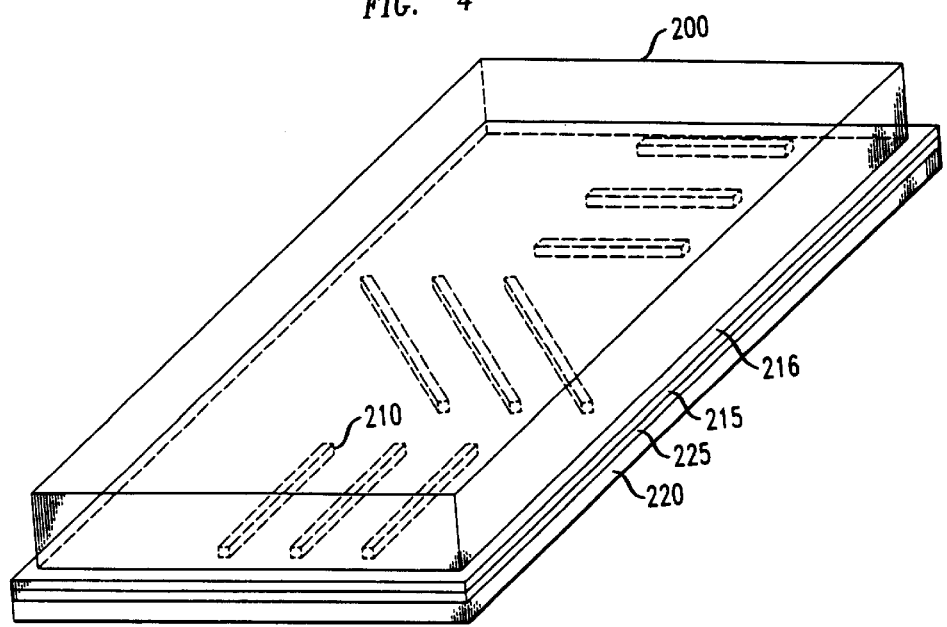

PATTERNED LIGHT EMITTING DIODE DEVICES

BACKGROUND OF THE INVENTION

1. Technical Field

The invention is directed to Light Emitting Diodes (LEDs) and, in particular, to LEDs that emit light in a pattern.

2. Art Background

Flat panel displays containing light emitting diodes are ubiquitous features of many products. Because of the need to minimize the manufacturing cost of most products, inexpensive ways to manufacture flat panel displays are of considerable interest. As noted in Lidzey, D. G., et al., "Photoprocessed and micropatterned conjugated polymer LEDs," *Synthetic Metals*, Vol. 82, pp. 141–148 (1996), organic materials have been investigated for use as the emissive layers in LEDs because large-area devices can be made cheaply and easily using such materials. Also, a greater variety of emission colors is obtained when organic emissive layers are used instead of inorganic emissive layers. LEDs with organic emissive layers have a greater electrical efficiency than comparable LEDs with an inorganic emissive layer.

LEDs are generally formed on transparent substrates such as glass or plastic. A light emitting material is sandwiched between an anode formed on the substrate and a cathode. When current is supplied to the anode, electrons and holes recombine in the light-emitting material sandwiched between the anode and the cathode. As a result of this recombination, light emits from the light-emitting material and through the transparent substrate.

One use for LEDs is in displays having a fixed pattern. In such displays, there are at least two areas of contrast when the display is on. The areas of contrast (e.g. light and dark) provide a desired picture (e.g., a logo) or message (e.g. an "EXIT" sign). Such a patterned array of LEDs is described in the previously mentioned Lidzey et al. reference which was mentioned previously. A patterned cathode is formed over an emissive layer (poly(2,5-dialkoxy-p-phenylenevinylene). When a voltage is applied to the ITO anode, light is emitted in a pattern that corresponds to the cathode pattern, because light is only emitted from those portions of the emissive layer sandwiched between the anode and the cathode. A patterned display is also obtained by patterning the anode instead of the cathode.

However, there are certain limitations on the patterns that can be obtained by patterning the anode or the cathode. For example, a simple pattern such as the letter "O" is not easily obtained by patterning the cathode. This is because the mask used to form the pattern must be one integral unit. The letter "O" requires complete physical separation between the portion of the mask inside the "O" from the portion outside the "O." Such a complete physical separation cannot be obtained in a single unit mask. There must be some physical connection between the portion of the mask inside the "O" and the portion of the mask outside the "O." Furthermore, the expedients used to pattern the cathode in the manner described in Lidzey et al. degrade the organic emissive layer underlying the cathode.

Different restrictions are placed on a patterned anode such as indium tin oxide. For example, the conductivity of ITO is reduced when patterned into narrow lines. Therefore, the brightness of the display is not evenly distributed if a narrow portion of ITO is required by the pattern. Furthermore, the ITO must be electrically interconnected and therefore a pattern that is not continuous is not practicable.

In response to the limitations imposed by patterning anodes and cathodes, Renak, M., et al., Microlithographic Process for Patterning Conjugated Emissive Polymers," *Advanced Materials*, Vol. 9, No. 5, pp. 392–395 (1995) describes a patterned LED display in which the electron emissive layer (poly(p-phenylenevinylene)) is patterned. Renak et al. describes a device in which the patterned layer of poly(p-phenylenevinylene) (PPV) is formed over an ITO layer. An electron transport layer was cast over the PPV layer. A cathode was formed over the electron transport layer. The electron transport layer is present to prevent direct electrical contact between the ITO anode and the cathode.

When a voltage is applied to the ITO of the device described in Renak et al., light is emitted from the patterned PPV layer in the pattern of the PPV layer. However, the approach does not afford much flexibility, as the only contrast provided by such a display is the contrast between the PPV area of the display (which emits light when the device is on) and the non-PPV area of the display (which does not emit light even when the device is on). Thus the basis for contrast in such a display is basically either on or off. Furthermore, Renak et al requires the use of light-emitting polymers that are also photosensitive in order to pattern the light-emitting layer. Thus, the choices for the lightemitting material for the Renak et al. device are extremely limited.

A display that provides the potential for a greater variety of visual contrast, yet does not require that either the anode or the cathode be patterned, is desired.

SUMMARY OF THE INVENTION

LED devices have a layer or layers of active material sandwiched between an anode and a cathode. Active layers, as used herein are layers of material in which either electron transport, hole transport, light emission, or some combination there, occur. The present invention is directed to an LED device in which at least one of the active layers is patterned to have at least a first thickness and a second thickness. The patterned organic layer is sandwiched between an anode and a cathode. When the LED device is on (i.e. when sufficient current is provided to the anode to induce electron/hole recombination in the light emitting layer) there is a visually perceivable contrast between the portion of the LED device that corresponds to the active layer of the first thickness and the portion of the LED device that corresponds to the active layer having the second thickness.

The active layer is one or more layers of organic material. In one embodiment, the active layer is a patterned layer of a material in which electron/hole recombination and, thus, light emission occurs. In a second embodiment, the active layer is a combination of two layers: a layer of material in which light emission occurs coupled with a hole transport or electron transport layer. The hole transport layer, if present, is in contact with the anode. The electron transport layer, if present, is in contact with the cathode. In the second embodiment, the aggregate thickness of the active layer (i.e. the combined thickness of the light emitting layer and the hole transport or electron transport layer) is not uniform because one of either the light emitting layer and the electron transport layer or the hole transport layer is patterned. An active layer consisting of a patterned electron transport layer formed on a layer of light emitting material of uniform thickness is one example.

In a third embodiment both the light emitting layer and the hole transport or electron transport layer are patterned.

However, the patterns are complimentary (the thinner portion of one layer is aligned with the thicker portion of the other layer and vice-versa) so that the aggregate thickness of the two layers is uniform.

As a result of the one or more patterned layers in the active layer, the LED device emits light through one portion associated with a first layer thickness that is visually distinct from a second portion of the LED device associated with a second layer thickness. In the context of the present invention, the thickness that is referred to is the thickness of the patterned layer and not the aggregate thickness of the active layers. In one embodiment of the present invention, when the LED is on, the LED device only emits light through the portion associated with the thinner portion of the patterned light-emitting layer and not through the second portion associated with the thicker portion of the light-emitting layer. In an alternate embodiment, the LED device emits light of a first color through the first portion and light of a second color through the second portion. In yet another emobodment, the LED device emits light of a first intensity through the first portion and light of a second intensity through the second portion. In this embodiment, the difference between the first intensity and the second intensity is visually perceivable.

It is also contemplated that the patterned layer has more than two thicknesses. When the LED device is on, the region of the LED device associated with a particular thickness of the patterned layer is visually distinct from the other regions associated with the other thicknesses. The LED device of the present invention provides the flexibility to produce LED devices in a variety of patterns. The LED devices of the present invention are produced at low cost because of the ease in which a patterned layer is formed.

Since the light-emitting material of the LED of the present invention is sandwiched between an anode and a cathode, one of either the anode or the cathode is transparent to the emitted light so hat the light emission is observable. Typically one of either the anode or the cathode is formed on a substrate. If the transparent anode is formed on a substrate, then the substrate on which the anode is formed is also transparent. Similarly, if the transparent cathode is formed on a substrate, then the substrate on which the cathode is formed is also transparent. For convenience, in the embodiments described herein, the anode is formed on the substrate. However, the present invention contemplates that the patterned active layer of the device of the present invention can also be placed between a cathode formed on a substrate and an anode. Furthermore, in certain embodiments the anode or the cathode is the substrate.

In one embodiment of the present invention, the LED device is formed by spinning a precursor of the organic light emitting material on a transparent substrate with an anode formed thereon. It is advantageous if the precursor is soluble in an organic solvent such as methanol. A mold is used to form the layer of precursor into a desired pattern. An elastomeric mold that has a first surface with a recessed portion in the desired pattern is one example of a suitable mold. The recessed portion functions as a channel for the precursor when the mold surface is placed in contact with the layer of organic light emitting material.

The mold surface is wetted with an organic solvent. When the wetted surface contacts the precursor, the precursor is partially dissolved and the dissolved precursor fills the channels in the mold. The solvent is evaporated and the mold is removed. After the mold is removed, the precursor layer has a surface relief pattern that corresponds to the pattern in the mold. In order to form a light emitting layer with three or more thicknesses, a mold that has channels with more than one depth is contemplated as suitable.

In the context of the present invention, any light emitting material that can be formed on a substrate in a desired pattern is contemplated as suitable. A precursor of poly(p-phenylene vinylene) is one example of a suitable material.

BRIEF DESCRIPTION OF THE DRAWINGS

The advantages, nature and various additional features of the invention will appear more fully upon consideration of the illustrative embodiments now to be described in detail. In the accompanying drawings:

FIG. 3 is a perspective view of an elastomeric material in contact with the relief pattern of FIG. 2.

FIG. 4 is a perspective view of a mold in contact with a layer of light-emitting material.

DETAILED DESCRIPTION

The present invention is directed to an LED device that has an active layer that is sandwiched between an anode and a cathode. The active layer at least contains a layer of light emitting material, and optionally contains either an electron transport layer, a hole transport layer, or both. At least one of the light emitting layer, electron transport layer or hole transport layer has at least a first thickness and a second thickness. When the LED device is on, a first portion of the LED device associated with the portion of the layer having the first thickness is visually distinct from a second portion of the LED device associated with the portion of the layer having the second thickness. In one embodiment of the present invention, the first portion of the LED emits light and the second portion does not emit light. In a second embodiment of the present invention, the first portion emits light of a first color and the second portion emits light of a second color. In a third embodiment of the present invention, the first portion emits light of a first intensity and the second portion emits light of a second intensity.

In an alternate embodiment of the present invention, there are more than two portions of the LED device, each associated with a different layer thickness Each portion is visually distinct from the other portions when the LED device is on (i.e. the first portion is off, the second portion is a first color, the third portion is a second color, etc.).

Figure 1:
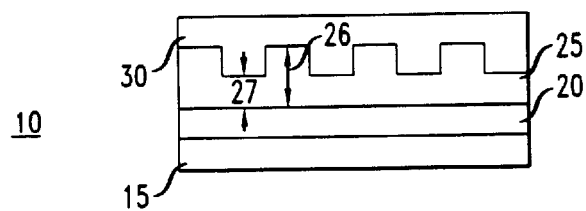
FIG. 1 is a schematic side view of an LED device of the present invention.

One example of an LED device of the present invention is illustrated in FIG. 1. The LED device 10 is formed on a transparent substrate 15. Examples of suitable substrates include glass and transparent plastic substrates. The use of plastic substrates is limited because the substrate cannot be exposed to temperatures that exceed the melting point of the substrate during subsequent processing. However, plastic substrates are attractive alternatives when suitable because they are lightweight, inexpensive, and flexible, among other advantages.

An anode 20 is formed on the substrate 15. The anode is a conventional material such as indium tin oxide (ITO). A layer of a light emitting material 25 is formed on the anode 20. The light emitting material is an organic material such as poly(p-phenylene vinylene) (PPV). Organic light emitting materials are well known to one skilled in the art.

The layer of light emitting material has two thicknesses 26 and 27. The voltage required to induce light emission from an organic light emitting films is dependent on film thickness. For example, a voltage of 6V must be supplied to the anode to induce light emission in an 80 nm thick PPV film. A voltage of 12 V must be supplied to the anode to induce light emission in a 200 nm thick PPV film. Therefore, if, for example, a PPV film has a first thickness of 80 nm and a second thickness of 200 nm, the portion of the film that is 80 nm thick will emit light when 6 volts is applied to the anode. However, the portion of the film that is 200 nm thick will not emit light when 6 volts is applied to the anode. In the LED device depicted in FIG. 1, the first thickness 26 is selected so that, when the device is on, the light emitting layer does not emit light. The second thickness 27 is chosen so that, when the device is on, the light emitting layer emits light.

A cathode 30 is formed over the layer of light emitting material. Conventional cathode materials are well known to one skilled in the art. All of these cathode materials are contemplated as suitable. Examples of suitable cathode materials are calcium, magnesium and aluminum.

In the embodiment of the present invention wherein light is emitted through the cathode, the cathode is transparent. One example of a transparent cathode is a layer of aluminum that is sufficiently thin so that light emitted by the organic light-emitting layer passes through it. In this embodiment, the substrate is not transparent, nor is the anode required to be transparent.

The thickness of the light emitting layer is controlled to provide an LED device that emits light in a desired pattern. In the embodiment of the present invention wherein light is emitted by the first portion of the LED device and not emitted by the second portion of the device, the light emitting layer is patterned so that the thinner portion corresponds to the desired pattern and the thicker portion corresponds to the inverse of the desired pattern. A number of techniques for forming the layer of light emitting material with two thicknesses, the first thickness forming a desired pattern in the layer and the second thickness forming the inverse of that pattern, are contemplated as suitable.

Figure 2:
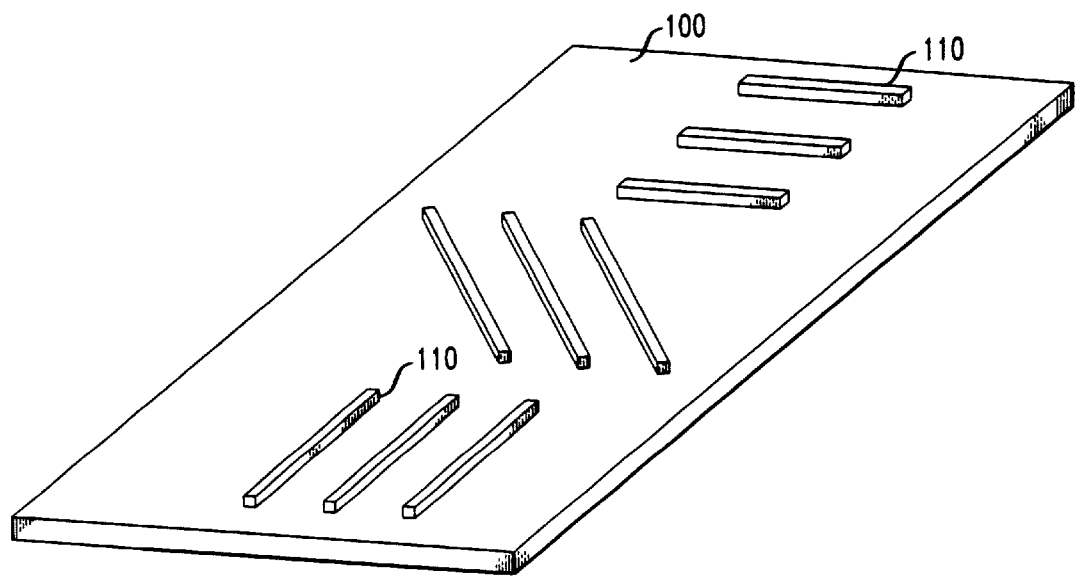
FIG. 2 is a perspective view of a relief pattern used to form a mold which is then used to form a patterned layer of light-emitting material.

One example of a suitable technique involves the use of a mold. In this technique, a mold is formed by casting an elastomeric material against a topographic patterned surface. The patterned surface is the desired pattern to be formed in the light emitting layer. An example of a topographic surface is illustrated in FIG. 2. The surface 100 has raised portions 110 formed thereon. The raised portions are formed used conventional lithographic techniques in which a layer of energy-definable material is formed on a planar substrate. A pattern is introduced into the layer of energy-definable material by introducing an image of that pattern into the layer of energy-definable material. That image is introduced by exposing the energy-definable material to patterned radiation. The radiation introduces a chemical contrast between the exposed and unexposed portions of the energy-definable material. The pattern is developed by exploiting the chemical contrast between the unexposed portion and the exposed portion of the energy-definable material That is, the portion of the energy-definable material that does not correspond to raised portion 110 in FIG. 2 is removed from the substrate.

The height of the raised portions 110 corresponds to the difference between the first thickness and the second thickness in the light emitting layer. Referring to FIG. 3, a layer of a liquid precursor of an elastomeric material 200 is formed over topographic surface 110. The topographic surface forms an impression in the elastomeric material precursor 200. The elastomeric material 200 is solidified and separated from the topographic surface 110.

Referring to FIG. 4, the solidified, elastomeric material 200 with impressions 210 formed therein is placed in contact with an organic light emitting material 215 formed on a substrate 220 with an anode 225 (ITO) formed thereon. The light emitting material 215 has a viscosity that permits it to flow into the impressions 210, which serve as capillary channels for the light emitting material 215. One way to induce the light emitting material to flow into the impressions is to select a material such as a precursor of poly(p-phenylene vinylene) which can be spin cast onto the ITO-coated substrate. Since the precursor is soluble in organic solvent, the surface 216 of the elastomeric material is wetted with an organic solvent such as methanol. Bringing the precursor into contact with the solvent-coated elastomeric mold partially dissolves the precursor and causes it to flow into the channels.

Figure 5:
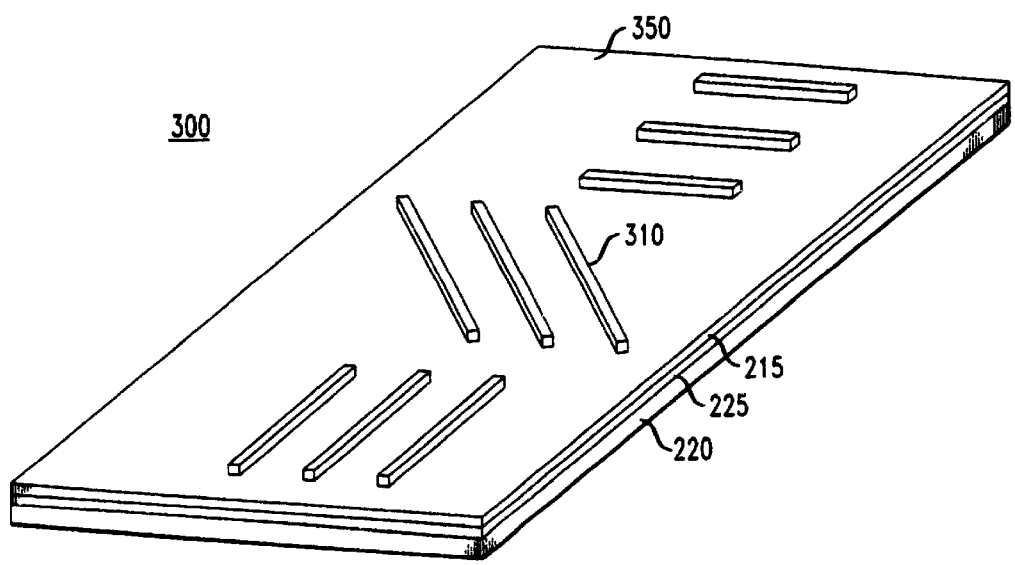
FIG. 5 is a perspective view of a layer of light-emitting material with a relief pattern formed therein.
Figure 6:
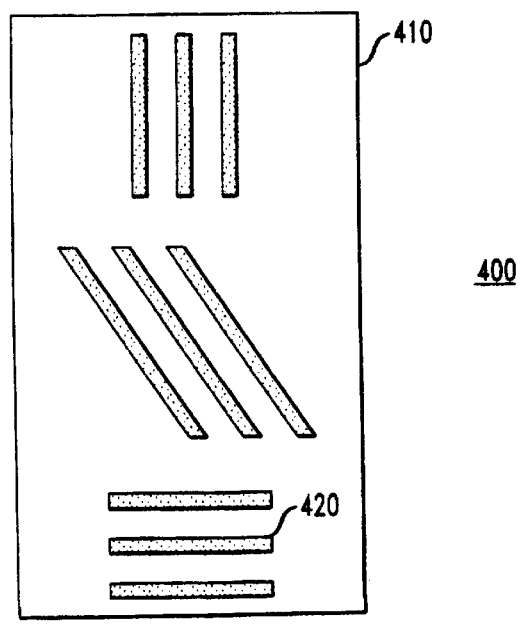
FIG. 6 is a top view of a patterned LED device of the present invention in its on state.

After the precursor has been molded into the desired pattern, the elastomeric material is removed from contact with the light emitting material. If a precursor of the light emitting material is used, that precursor is then converted to the light emitting material using the requisite expedient (e.g. heating). The resulting structure 300 is illustrated in FIG. 5. In FIG. 5 the layer of light emitting material 215 is formed on the glass substrate 220 with the layer of ITO 225 formed thereon. The layer of light emitting material 215 has the relief pattern formed therein which consists of a pattern of raised portions 310 with a desired orientation and thickness. The thickness of the raised portions 310 is selected so that light will not emit from these portions of the layer 215 when the LED device is on. The thickness of the tinner portion 350 of layer 215 is selected so that light will emit from this portion of the layer when the LED device is on. The emission pattern of the LED device formed from the structure illustrated in FIG. 5 is illustrated in FIG. 6. The light portion 410 of the LED device 400 corresponds to the pattern of the thinner portion of 350 of layer 215 (FIG. 5) from which light does emit. The dark portion 420 of the LED device 400 corresponds to the pattern of the thicker portion 310 of layer 215 (FIG. 5).

EXAMPLE 1

Films of a precursor of poly(p-phenylene vinylene) synthesized from p-xylenebis(tetrahydrothiophenium chloride) via the Wessling route were spin cast onto an ITO-coated glass substrate. The precursor was obtained from Lark Enterprises of Webster, Mass. The films was cast onto the substrate at a speed of 500 to 1000 rpm for 45 seconds. The thickness of the resulting films were between 50 nm and 150 nm.

An elastomeric mold having a series of impressions formed in one surface thereof was used to mold the precursor films. The impressions in the surface of the elastomeric mold had a width of about 2 $\mu$m to about 15 $\mu$m and a depth of 300 nm. The impressions were introduced into the surface of the elastomeric mold by forming the elastomeric material over a topographic surface. The raised portions of that surface formed the impressions in the elastomeric material The raised portions were prepared by patterning a layer of energy sensitive material on a substrate. Conventional lithographic techniques were used to pattern the energy sensitive material.

The surface of the elastomeric mold was wetted with methanol. The surface of the elastomeric mold with the impressions therein was brought into contact with the PPV precursor. After the solvent was evaporated, the mold was removed from contact with the precursor. The precursor was then baked at a temperature of 260° C. in vacuum (about $10^{-6}$ Torr) for about 10 hours. Atomic force microscopy confirmed that the baking step did not significantly alter the surface relief imparted by the mold. A dual layer cathode was formed over the topographic PPV layer by vacuum deposition of a layer of calcium (40 nm thick) followed by a layer of aluminum (200 nm thick).

Light was observed to emit from the thinner (about 100 nm thick) portion of the PPV film when at least about 8 volts was applied to the resulting device. At this voltage light did not emit from the thicker (about 400 nm thick) portion of the PPV film. The device was observed to have an external quantum efficiency of about $10^{-3}\%$ photons/electron. The efficiency could be improved by forming a layer of electron transport material over the PPV layer, choosing polymers with greater efficiency, or doping the polymer with a dye.

In order to avoid a change in brightness at the portion of the LED device that corresponds to a change a thickness of the light emitting film in the device, one skilled in the art will appreciate that a steep profile is advantageous. The more gradual the transition from first thickness to second thickness in the light emitting film thickness, the greater the blur between the light emission effect of the first thickness and the light emission effect of the second thickness. Such a steep profile is obtained by ensuring that the indentations in the mold surface have the desired profile. The precision of these indentations is in turn dependent upon the accuracy of the method used to form the indentations. In the embodiment of the present invention wherein the indentations are formed by casting an elastomeric film over a topographic surface, the lithographic technique employed to form topographic surface must be sufficiently precise to form features with the requisite profile.

In an alternate embodiment, two or more different organic light emitting materials are used to form an LED device that emits light in a desired pattern. For example, a first material emits green light when a first threshold voltage is applied to an LED device with the first organic light emitting material. A second material emits red light when a second threshold voltage is applied to an LED device with the second material. The threshold voltage is the voltage that is required for light emission to occur. If a voltage that is less than the threshold voltage is applied to the device, no light emits from the organic light emitting material.

Figure 7A:
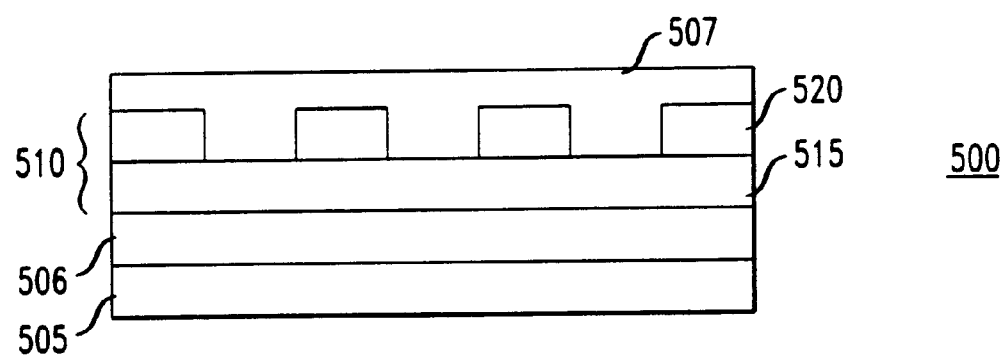
FIG. 7A is a schematic side view of a second embodiment of an LED of the present invention.
Figure 7B:
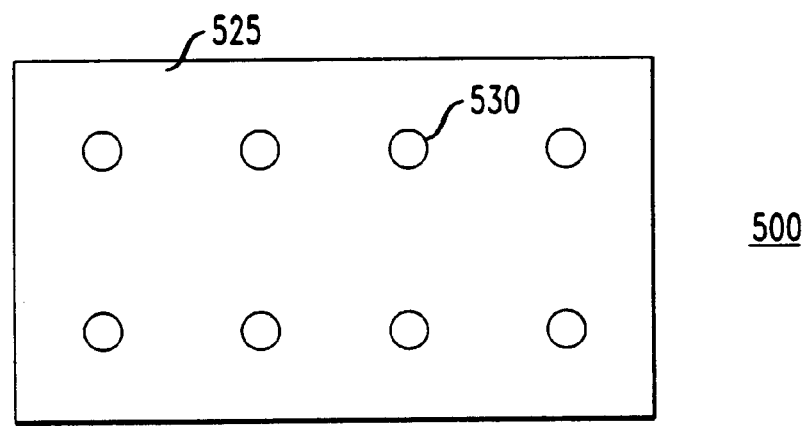
FIG. 7B is a top view of the device of FIG. 7A in its on state.

An LED device that emits light in a desired pattern is formed using such materials. An example of such a device is illustrated in FIG. 7A. The LED device 500 has a light emitting layer 510 which is sandwiched between a transparent substrate 505 with an anode 506 formed thereon and a cathode 507. The light emitting layer 510 has a first continuous layer of the first material 515 that has a patterned layer of the second material 520 formed thereon. Referring to FIG. 7B, which is a top view of the device 500 in its on state, the portion of the LED device 500 associated with the single layer of the first material is 525. The portion of the LED device associated with the dual layer of first material 515 and second material 520 is 530.

If the first threshold voltage is greater than the second threshold voltage, then if a voltage is applied to the device 500 that is greater than the first threshold voltage but less than the second threshold voltage, portion 530 emits light and portion 525 does not. If a voltage is applied to the LED device that is greater than the threshold voltages of both the first material and the second material, then portion 530 emits light in one color and portion 525 emits in another color.

For example, a device which, when a certain threshold voltage is applied, emits red from one portion and green from another portion of the device is prepared by farming a layer of PPV on an ITO coated transparent substrate. A 100 nm thick layer of PPV emits green light when 8 volts are applied to an LED device with such a layer. A layer of ALQ (aluminum tris(8-hydroxyquinoline) is formed over the PPV layer. Since ALQ over PPV also emits green light, the ALQ layer is doped to change the color of emission from green to a color that contrasts with the green light emitted by the single layer of PPV. The color of emission can be changed by doping the ALQ layer with a fluorescent dye such as 4-(dicyanomethylene)-2-methyl-6-(4-dimethylaminostyryl)-4H-pyran (DCM) or 5,10,15,20-tetraphenyl-21H,23H-porphine. The concentration of dye in the ALQ layer is typically about 1 to about 5 weight percent. In some instances even higher concentrations of dye are used.

The ALQ layer is patterned. The ALQ layer emits at a lower threshold voltage than the PPV layer. Therefore, when a voltage is applied to the LED device that is greater than the threshold voltage of the doped ALQ layer but less than the threshold voltage of the PPV layer, light emits from the device in the pattern defined by the dual ALQ\PPV layer. No light emits from the pattern defined by the single PPV layer. When a voltage is applied to the LED device that is greater than the threshold voltages of both layers, red or red orange light (depending upon the choice of dopants described above) emits from the dual layer of doped ALQ and PPV. Green light emits from the single layer of PPV.

The patterned ALQ layer is formed on the PPV layer by vacuum deposition using a shadow mask or by printing a solution soluble red-emitting material on the PPV in the desired pattern. Examples of suitable printing techniques include screen printing, inkjet printing or spraying. In one embodiment of the invention, a layer of undoped ALQ is formed over the patterned, doped layer of ALQ. In this embodiment, there is only one threshold voltage for emission. When the LED device is on, red or red orange light (depending upon the choice of dopants described above) emits from the tri layer of undoped ALQ, doped ALQ and PPV. Green light emits from the dual layer of undoped ALQ and PPV.

In another embodiment of the present invention, the voltage applied to the device is selected to have a particular effect. In the device of the present invention, the voltage is selected so that light emits only from the portion of the patterned layer that transitions from the first thickness to the second thickness. Although applicants do not wish to be held to a particular theory, it is believed that the selective emission from the transition region is due to the steep slope of the material as it transitions from the first thickness to the second thickness. Light emits from this transition region at a voltage that is less than the voltage required for the first portion of the LED to emit light preferentially over the second portion of the device. An LED in which light emits from ordered arrays of small sources is useful in a variety of applications that use patterned light such as near-field photolithography, near-field microscopy, spectroscopy, and high density optical data storage.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed is:

1. An LED device consisting essentially of:
    a substrate supporting an anode, a cathode and an active material sandwiched between the anode and cathode wherein the active material comprises at least one material layer that is a layer of organic light-emitting material and at least one material layer that is a patterned layer having a first thickness and a second thickness, wherein the layer of organic light-emitting material and the patterned layer are the same layer or different layers and wherein when a voltage that is sufficient to cause light to emit from at least a portion of the organic light-emitting material, a first portion of the LED device associated with the first thickness of the patterned layer is visually distinct from a second portion of the LED device associated with the second thickness of the patterned layer.

2. The LED device of claim 1 wherein the active material has a first material layer and a second material layer and wherein the first material layer is a light-emitting material layer with uniform thickness and the second material layer is a material selected from the group consisting of hole transport materials and electron transport materials that is patterned to have a first thickness and a second thickness.

3. The LED device of claim 1 wherein the active material has a first material layer and a second material layer and wherein the first material layer is a light-emitting material layer that is patterned to have a first thickness and a second thickness and the second material layer is selected from the group consisting of hole transport materials and electron transport materials that is patterned to have a first thickness and a second thickness.

4. The LED of claim 1 wherein the first portion of the LED emits light and the second portion does not emit light.

5. The LED of claim 1 wherein the first portion of the LED emits light of a first color and the second portion of the LED emits light of a second color.

6. The LED of claim 1 wherein the first portion of the LED emits light of a first intensity and the second portion of the LED emits light of a second intensity.

7. The LED of claim 1 wherein the LED emits light from boundaries between the first portion and the second portion.

* * * * *